United States Patent
Syrjärinne

(12) 
(10) Patent No.: US 6,609,080 B1
(45) Date of Patent: Aug. 19, 2003

(54) MULTIPLE-MODEL NAVIGATION FILTER WITH HYBRID POSITIONING

(75) Inventor: Jari Syrjärinne, Tampere (FI)

(73) Assignee: Nokia Mobile Phones Ltd, Espoo (FI)

( * ) Notice: Subject to any disclaimer, the term of this patent is extended or adjusted under 35 U.S.C. 154(b) by 0 days.

(21) Appl. No.: 09/444,584

(22) Filed: Nov. 22, 1999

(51) Int. Cl.$^7$ .............................................. G01B 21/12
(52) U.S. Cl. ...................................... 702/150; 702/150
(58) Field of Search .......................... 73/152; 324/326; 342/357, 357.03, 351.09, 90; 364/453; 367/135; 455/456; 701/220

(56) References Cited

U.S. PATENT DOCUMENTS

| | | | | |
|---|---|---|---|---|
| 4,535,625 A | * | 8/1985 | Lyle, Jr. ........................ | 73/152 |
| 5,144,595 A | * | 9/1992 | Graham et al. .............. | 367/135 |
| 5,355,316 A | * | 10/1994 | Knobbe ........................ | 364/453 |
| 5,381,095 A | * | 1/1995 | Andrews ..................... | 324/326 |
| 5,506,817 A | * | 4/1996 | Obrien ........................ | 367/135 |
| 5,511,042 A | * | 4/1996 | Obrien ........................ | 367/135 |
| 5,525,995 A | * | 6/1996 | Benner ........................ | 342/90 |
| 5,537,368 A | * | 7/1996 | Obrien ........................ | 367/135 |
| 5,828,336 A | | 10/1998 | Yunck et al. | |
| 5,883,595 A | * | 3/1999 | Colley ........................ | 342/357 |
| 5,902,351 A | * | 5/1999 | Streit et al. ................. | 701/220 |
| 6,127,968 A | * | 10/2000 | Lu ........................... | 342/357.03 |
| 6,266,533 B1 | * | 7/2001 | Zadeh et al. ................ | 455/456 |
| 6,285,315 B1 | * | 9/2001 | Pratt ....................... | 342/357.09 |

OTHER PUBLICATIONS

Yaakov Bar–Shalom (1995) "Multitarget–Multisensor Tracking Principles and Techniques", NMP Research and Technology.*

Greg Welch and Gary Bishop (1995). "An Introduction to the Kalman Filter," University of North Carolina at Chapel Hill, Department of Computer Science, Chapel Hill, NC, USA. TR95–041.*

Jiao Shuhong, Si Xicai and Kong Fanru (1998), "A Time–of Arrival Location for Maneuvering Target on Two–dimensional Surface", Signal Processing Proceedings 1998, ICSP98, 1998 Fourth International Conference vol. 2 1998 pp 1700–1703.*

Nathan A White, Peter S Maybeck and Stewart L DeVilbiss (1998), "Detection of Interference/Jamming and Spoofing in a DGPS–Aided Inertial System", IEEE Transactions On Aerospace And Electronic Systems vol. 34 No. 4 Oct. 1998 pp 1208–1217.*

"Multitarget–Multisensor Tracking Principles and Techniques," Y. Bar–Shalon pp. 1, 46 and 20, 1995.

"An Introduction to the Kalman Filter," Welch et al., pp. 1–16, Sep. 17, 1997.

*Enhancements to a Multiple Model Adaptive Estimator/Image–Tracker*, David M. Tobin, Pater S. Maybeck, IEEE Transactions on Aerospace and Electronic Systems, vol. 24, No. 4, July 1988, pg. 417–425.

* cited by examiner

*Primary Examiner*—John Barlow
*Assistant Examiner*—Douglas N Washburn
(74) *Attorney, Agent, or Firm*—Ware Fressola Van Der Sluys & Adolphson LLP

(57) ABSTRACT

A positioning system including a measurement engine, a model selector and model bank, and a filter, which is preferably a statistical filter. The measurement engine is responsive to information provided by a source of range information, from which a measurement of the state of motion of an object (including for example the position of the object) can be determined, and provides a succession of measurements of the state, each corresponding to a different instant of time. The model selector and model bank selects at least one motion model for use in estimating the state for a segment of the motion of the object. The filter is responsive to the succession of measurements of the state, and further responsive to a model mixing parameter and to the selected motion models. It determines a succession of multiple-model state estimates, preferably according to the so-called interacting multiple-model.

35 Claims, 3 Drawing Sheets

MULTIPLE-MODEL NAVIGATION FILTER WITH HYBRID POSITIONING

FIELD OF THE INVENTION

The present invention relates to the field of navigation positioning systems using signals from satellites and cellular networks. More particularly, the present invention relates to filters that are a part of such navigation systems.

BACKGROUND OF THE INVENTION

In a global positioning system (GPS), a user's position, velocity and time (PVT) are obtained from satellite-to-user ranges. (It is said that the user's time is obtained to indicate that the time of transmission of the satellite-to-user range information, relative to the user's time, is obtained from the range signal.) By making measurements to more than three satellites the user's three-dimensional position can be estimated, together with the user's (three-dimensional) velocity. The position estimate is processed in a navigation filter, which is an essential part of a stand-alone or network-assisted GPS receiver. A network-assisted GPS receiver is a GPS receiver that uses, for some of the filtering computation, computing facilities separate from the user, and in communication with the user's GPS receiver through a network, such as a cellular (telecommunications) network (NW).

Besides using satellite-to-user ranges, a positioning system can also use range information provided by base stations of a cellular network, i.e. base station-to-user ranges. Cellular ranges are obtained differently than range information in the GPS system, and only three range measurements are required to produce a user position and velocity estimate using cellular ranges. At this time, positioning systems are not designed to use cellular range information, because cell identification reports are not yet included in signals from cellular base stations. However, the wideband code division multiple access (W-CDMA) system, now under development, already has the capability to provide cell identification and thus enable cellular positioning.

There are many ways to compute a user's PVT from range measurements, but for combined GPS and cellular positioning (hybrid positioning), the well-known extended Kalman filter (EKF) is a suitable choice. An EKF, or a Kalman filter generally, uses a recursive algorithm that produces an estimate of the user's PVT making use of the history of PVT measurements. A Kalman filter smoothes the sequence of measurements, so as to provide a user PVT estimate by filtering the measurements based on pre-defined states and models, and based on measurement noise.

The accuracy of the user PVT estimate obtained from the Kalman filter is dictated by the states and noise levels chosen for use with the filter. A drawback of a pure Kalman filter solution is that if the states are chosen poorly, the outcome of the Kalman filter (KF) will not be satisfactory. In such a case it is said that the filter is inconsistent. The states can be selected so as to provide too great a flexibility (number of states and corresponding derivatives is too large) or so as to provide too little flexibility (too few states are used).

It is hard to find a suitable set of states as well as a suitable number of states in the chosen set of states so as to provide satisfactory estimates in a large number of cases (applications). Usually, a KF-based navigation filter is tuned to a certain subset of all possible cases resulting in a sub-optimal solution for some cases outside of the chosen subset of cases. For example, a KF-based navigation filter designed and tuned for vehicles is not very suitable for pedestrian use or for aircraft positioning. It is consistent only for a limited set of cases.

What is needed is a way of solving the inconsistency problem of a KF-based positioning system, i.e., of avoiding the problem of having to tune such a positioning system to one particular subset of cases. Ideally, what is needed is a way of adapting the subset of cases to which a KF-based positioning system is tuned so as to maintain consistency even if the character of the motion of the object being tracked changes significantly, i.e., what is needed ideally is a way to make a tuned KF-based positioning system that is robust.

SUMMARY OF THE INVENTION

Accordingly, the present invention is a generalized positioning system for estimating the state of motion of an object, a corresponding filter, and a corresponding method, the generalized positioning system including: a measurement engine, responsive to range information provided by a source of range information from which a measurement of the state can be determined, for providing a succession of state measurements, each measurement corresponding to a different instant of time; a model selector and model bank for selecting at least one motion model for use in estimating the state for a segment of the motion of the object; and a filter, responsive to the succession of state measurements, and further responsive to a model mixing parameter and to the selected motion models, for determining a succession of multiple-model estimates of the state.

The filter is preferably a statistical filter, and the multiple-model state estimates are, preferably, as provided by the so-called interacting multiple model.

In another aspect of the invention, the generalized positioning system also includes: a weighted least squares filter, also responsive to the state measurements, for directly determining a succession of weighted least squares state estimates; and a consistency checker, responsive to the weighted least squares state estimates and to the multiple-model state estimates, for selecting either the weighted least squares state estimate for an instant of time or the multiple-model state estimate for the instant of time, based on the multiple-model state estimate as well as on previous multiple-model state estimates.

In a still further aspect of the invention, the source of range information is a cellular base station, and in a still further aspect of the invention, the source of range information is a satellite.

According to the method of the present invention, in estimating the state of motion of an object, the following steps are performed: acquiring a next state measurement in a succession of state measurements; selecting from a model bank (at least) two motion models for use in estimating the state for a segment of the motion of the object; determining a model mixing parameter for combining a next state estimate according to each of the two selected motion models; filtering each selected motion model to provide the next state estimate according to each of the two selected motion models based on the next state measurement; and combining the two next state estimates according to the model mixing parameter to provide a next multiple-model state estimate.

In a further aspect of the method of the invention, the following additional steps are performed: performing a weighted least squares filtering of the state measurements in parallel with the filtering of each selected motion model so as to directly determine a next weighted least squares state estimate from the next state measurement; and performing a consistency check, so as to be responsive to the next weighted least squares state estimate and to the next multiple-model state estimate, for selecting either the next weighted least squares state estimate or the next multiple-model state estimate, based on the multiple-model state estimate as well as on previous multiple-model state estimates.

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

In the preferred embodiment, the present invention involves the use of a statistical filter. In the best mode, such a filter is a Kalman filter, including e.g. an extended too Kalman filter (EKF) or other non-linear filter. Such a filter is said here to be "statistical" to indicate that it filters state measurements according to statistical measures involving current and previous state measurements, such as measurements of position or velocity or both.

It is to be understood, however, that the present invention is not restricted to using only a Kalman filter in such a system, but instead can use any kind of statistical filter in a position-measuring system, or in a system that measures another aspect of the motion of an object, such as velocity, and so is here called a generalized positioning system (because it does not necessarily measure position), i.e. the state information provided about the object using a navigation filter according to the present invention can, in some applications, not include position, but instead can include only some other aspect of the motion of the object. In case of estimating position, the system may aptly be called a "positioning system," even though it may estimate values for other aspects of the motion. But in other cases the aspect of the motion that is most important may be other than position; it may, for example, be angular velocity, or linear or angular acceleration, or simply linear velocity. In general, therefore, the present invention is for use as part of a system that is most aptly described as a generalized positioning system, and is to be understood to encompass estimating, in some applications, position, but in other applications, other aspects of motion, not necessarily including position.

Further, the making of a Kalman filter or other kind of statistical filter has not been disclosed here because a Kalman filter and other kinds of statistical filters are known. See, e.g. U.S. Pat. No. 5,902,351, entitled "APPARATUS AND METHOD FOR TRACKING A VEHICLE," issued May 11, 1999.

Figure 1:
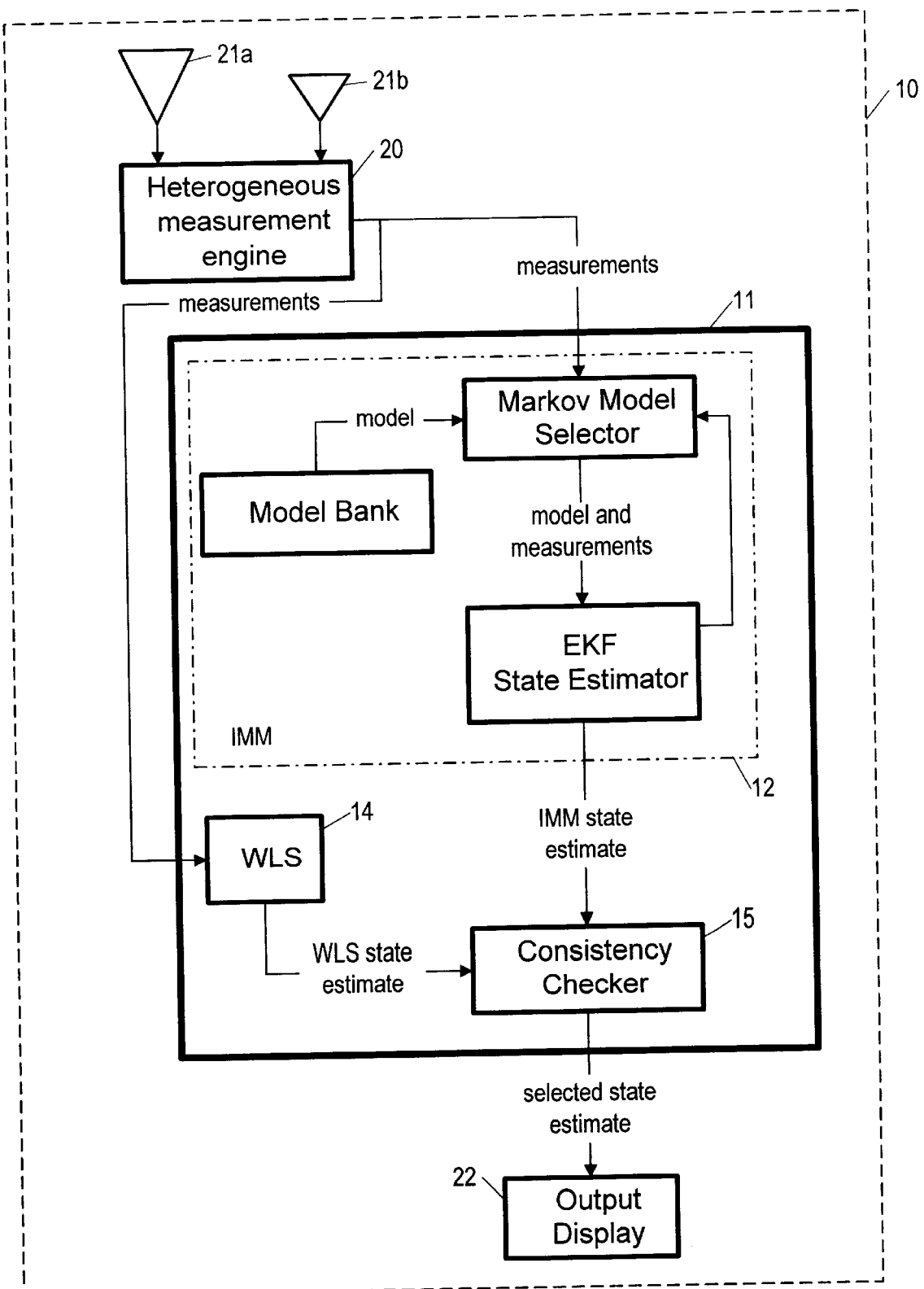
FIG. 1 is a block diagram of a robust navigation filter, i.e. a fused weighted least square (WLS) filter and an interacting multiple-model (IMM) filter, according to the present invention.

Referring now to FIG. 1, in the best mode of the present invention, a positioning system 10 includes a heterogeneous measurement engine for receiving both satellite-to-user range information as well as cellular base station-to-user range information, from which measurements of the current state of motion of the user of the positioning system are determined. The measurements are provided to two modules of a robust filter 11, one that includes an interacting multiple-model (IMM) module 12, and a weighted least squares (WLS) module 14, each of which compute a (usually different) state estimate (i.e. an estimate of position and possibly other aspects of motion such as velocity) based on the measurements. Both state estimates are provided to a consistency checker 15. The consistency checker selects the IMM state estimate unless there is an indication of inconsistency from the estimates being produced by the IMM module. In such a case, the consistency checker selects the WLS state estimate. The selected state estimate, or part of the estimate such as only position and velocity, is then provided to an output display 22.

IMM-Based Navigation Filter

Overview of IMM

Referring still to FIG. 1, the IMM module includes a database of motion models, called a model bank, an EKF state estimator, and an underlying Markov chain for selecting one or another of the motion models and for controlling the overall model combination, i.e. the way that the predictions of tracks according to different models are combined. The models forming the model bank may vary greatly from each other, i.e., some might model e.g. track split processes while others may model time-dependent non-linear maneuvers or simply uniform linear motion. The Markov chain is defined by a fixed and pre-determined probability transition matrix M. Although only a single EKF state estimator is shown in FIG. 1, if multiple tracks are combined for a segment, sometimes a different EKF estimator will be used for each model, as explained below.

Figure 2:
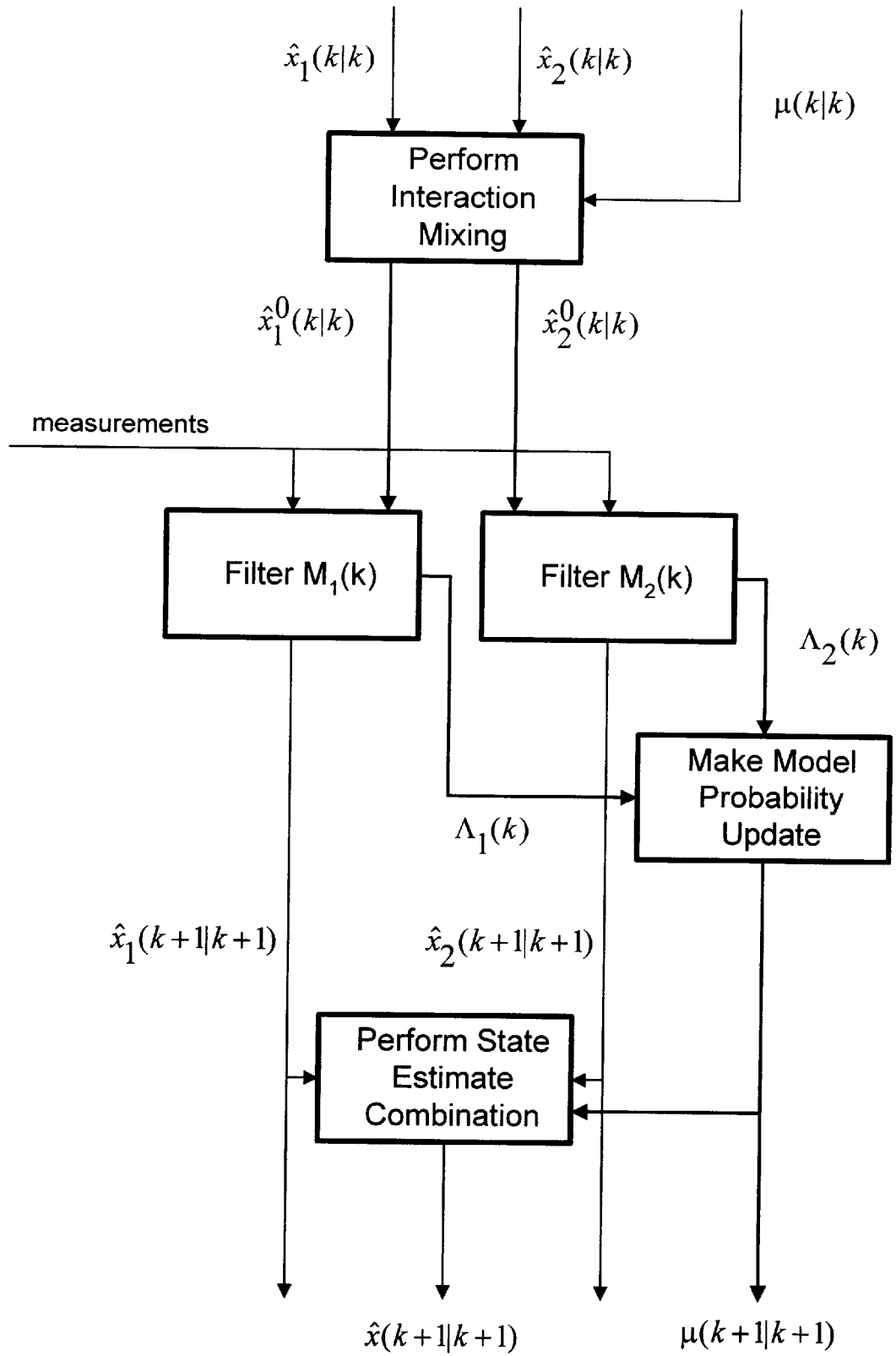
FIG. 2 is a flowchart of the IMM algorithm.

Referring now to FIG. 2, a flow diagram of IMM is shown, indicating that the positioning system 10 is able to use a combination of one or more selected models for any given segment of motion. FIG. 2 illustrates mixing only two models, based on a mixing parameter $\mu(k)$, although in principle any number of models can be mixed. In case of for example two models, as shown in FIG. 2, two different EKF filters can be used to each provide a state estimate according to a different one of the models. Sometimes, however, a single EKF filter is used to provide a state estimate for each model in turn.

There are several characteristics of the IMM of advantage in the problem solved by the present invention. The IMM can change gracefully between parallel motion models, always using a combination of individual models likely yielding good filter consistency. The IMM is decision-free i.e., no extra logic is required to govern switching from one model to another. In addition, the number of motion models in an IMM application can be arbitrary, and the models may have very different noise levels, structures or deterministic inputs.

Motion Models (Model Bank)

An essential part of any tracking algorithm is the model describing the expected motion of the object whose PVT is being determined. In a Kalman filter-based navigation filter without IMM, only one type of motion is selected beforehand. The motion is modeled by the states of the filter. However, using IMM, a number of different motions can be modeled and used in parallel.

It is natural to assume that the object using the positioning system, whether wheeled or non-wheeled, will occasionally maneuver, but otherwise will move with somewhat constant velocity. It is also obvious that maneuvers have to be compensated for so as to obtain continuous and reliable estimates of the object PVT. The better the predetermined motion model or models can accommodate the behavior of the object, the more accurate will be the outcome of the tracking algorithm (navigation filter) used by the positioning system, even during periods when the positioning system sensors for receiving range information are blacked-out or blocked by for example obstructions. Obviously, should the selected models be poorly suited, the PVT estimates of the navigation filter will be poor.

To cover a wide range of motion modes including also the static (non-moving) case, and to find out the best selection, the following motion model structures are selected. These can be parameterized to span even very unlikely maneuvers.

Static Model

In the case of a low level of process noise $\sigma_v^2$, a so-called static model is a good choice, i.e. a good choice for at least a segment of the motion of the object whose PVT is being determined. In the static model, the object is considered to be at rest (stopped, parked or fixed). The model consists of only five states, $x=[x\ y\ z\ t\ \dot{t}]^T$; all other states, e.g. each component of velocity or acceleration, are considered to be always equal to zero.

Constant Speed Model

For the segments with constant speed, a model consisting of eight states is used: $x=[x\ \dot{x}\ y\ \dot{y}\ z\ \dot{z}\ t\ \dot{t}]^T$. To make the filter more robust in terms of changes in speed, the following process noise covariance matrix is employed:

$$Q = \begin{bmatrix} 1 & & & & & & & \\ & 0 & & & 0 & & & \\ & & 1 & & & & & \\ & & & 0 & & & & \\ & & & & 1 & & & \\ & & & & & 0 & & \\ & 0 & & & & & 1 & \\ & & & & & & & 0 \end{bmatrix} \sigma_v^2.$$

In the constant speed model, the process noise variance $\sigma_v^2$ is set to a higher value than in the static model.

Turn Model

In the turn model, the average rate of turn (change in direction) is estimated. (The turning is considered rotational motion of the target with respect to a predetermined point.) The turn model is similar to the constant speed model, except that the rotation rate $\omega$ is included in the state vector x, and the process noise covariance matrix is extended by one row and one column:

$$Q = \begin{bmatrix} \sigma_v^2 & & & & & & \\ & 0 & & & & & \\ & & \sigma_v^2 & & 0 & & \\ & & & 0 & & & \\ & & & & \sigma_v^2 & & \\ & & & & & 0 & \\ & 0 & & & & & \sigma_v^2 \\ & & & & & & & \sigma_\omega^2 \end{bmatrix},$$

where $\sigma_\omega^2$ is the process noise variance for the turn rate. One such turn model is used for both clockwise and counterclockwise turning. The turn model is well suited to modeling segments of the motion of an object when the motion involves fairly constant turning, e.g. cars on highway ramps.

Colored Noise Models

Sometimes it is useful to assume that the motion of the object whose PVT is being determined is a correlated noise process (i.e. a random walk), rather than a white noise process. In such a model, the object acceleration is modeled as a zero-mean random process with an exponential autocorrelation function. The state vector x is considered to be of order 11, and in particular, $x=[x\ \dot{x}\ \ddot{x}\ y\ \dot{y}\ \ddot{y}\ z\ \dot{z}\ \ddot{z}\ t\ \dot{t}]^T$. The discrete state transition matrix for the x, y and z dimensions is:

$$F = \begin{bmatrix} 1 & T & \frac{(aT-1)e^{-aT}}{a^2} \\ 0 & 1 & \frac{(1-e^{-aT})}{a} \\ 0 & 0 & e^{-aT} \end{bmatrix},$$

where $\alpha$ is the time constant defining the reciprocal duration of the motion autocorrelation. With different parameterization of $\alpha$, different kinds of motion can be modeled. The corresponding process noise covariance matrix for the case $\alpha T \ll 1$ is, $$Q = 2\alpha\sigma_a^2 \begin{bmatrix} \frac{T^5}{20} & \frac{T^4}{8} & \frac{T^3}{6} \\ \frac{T^4}{8} & \frac{T^3}{3} & \frac{T^2}{2} \\ \frac{T^3}{6} & \frac{T^2}{2} & T \end{bmatrix},$$

where $\sigma_\alpha^2$ is the variance of the target acceleration, and T is the sample time, i.e. the time for which the position is being estimated.

Robust Filter—Navigation Filter with IMM and WLS

Overview of Robust Filter

Since any recursive navigation filter, including one using IMM, is in danger of becoming inconsistent in some extreme cases and yielding very poor solutions as a result, it is advantageous to have resort to a direct method in situations where consistency is suspect. A direct method differs from a recursive method in that it does not rely on measurement history; a direct method computes the user's PVT based only on the most current set of measurements. By resorting to a direct method in case of the filter becoming inconsistent, the danger is avoided that the filter will become biased away from the true solution because of for example a phenomenon persisting for a period of time and affecting the measurements used by the filter during that time.

Among the most common and reliable direct methods is any least squares-based method, e.g. a weighted least squares (WLS) method, as described below. In a navigation filter using WLS as a fallback estimator to IMM in case of consistency becoming suspect, a decision to switch from the IMM to instead use the WLS is based on self-diagnostics performed by the IMM, as described below. If the IMM is found too inconsistent with respect to the measurement innovations, the current user PVT solution is discarded and the IMM is reinitialized from the instantaneous WLS solution. By switching to WLS in case of potential inconsistency, unacceptable bias or even track loss can be avoided.

Weighted Least Squares Solution

In a WLS solution, each measurement is weighted to alter its importance relative to the other measurements. Such weighting allows taking into account the source of a measurement or indications of its quality (such as a signal to noise ratio or a bit error rate). The WLS solution is given by $$\Delta x = [H^T(W^{-1})H]^{-1}H^T(W^{-1})\Delta \rho,$$

where $$W = \begin{bmatrix} w_1 & & & \\ & w_2 & 0 & \\ & 0 & w_3 & \\ & & & w_4 \end{bmatrix}$$

is a (diagonal) weighting matrix having the measurement weight as its diagonal elements, and having the same dimensionality as $\Delta \rho$. The weights used in the WLS solution can be chosen based on carrier-to-noise ratio, or other indications of the quality of the measurement to be weighted. The WLS method can also be used to estimate user velocity from the delta-range measurements of the GPS.

Self-diagnostics

As mentioned above, even if the IMM is used with a very versatile model bank, it can become severely inconsistent in some cases. Before poor consistency causes track loss or severely biases the output (state estimates) of a navigation filter, the poor consistency should be identified and corrected. The present invention makes such an identification using self-diagnostics performed by the IMM.

The IMM uses a statistical test to detect poor filter consistency. The test uses so-called measurement innovations, also called measurement residuals, defined essentially (for a statistical filter such as a Kalman filter) to be the difference between the value of a measurement and the expected value of the measurement, the expected value being based on the previous estimate by the positioning system filter. The basic idea behind the test is that there is consistency only so long as the measurement innovations have essentially zero mean and have a magnitude commensurate with the innovation covariance calculated based on the outputs by the filter. These criteria can be tested from the normalized innovation squared (NIS) values, yielding the time-averaged NIS statistic:

$$\bar{e}_v(k) = \frac{1}{K(k)} \sum_{n=1}^{K(k)} v^T(n) S^{-1}(k) v(n),$$

where the summation is over the last K(k) samples (so that K(k) can be thought of as the number of samples in a sliding window enclosing only the last K(k) samples), and S(k) is the measurement covariance. If the innovations are white (zero mean), then $\bar{e}_v(k)$ is chi-square distributed, having $K(k)n_z$, degrees of freedom (where $n_z$ is the number of degrees of freedom of the measurement, which for only a range measurement is one, and for a combined range and Doppler measurement is two), and can be tested against a pre-defined acceptance interval. If at some instant of time the filter using IMM is detected to be inconsistent, it can be reinitialized according to the WLS solution for the instant of time.

Figure 3:
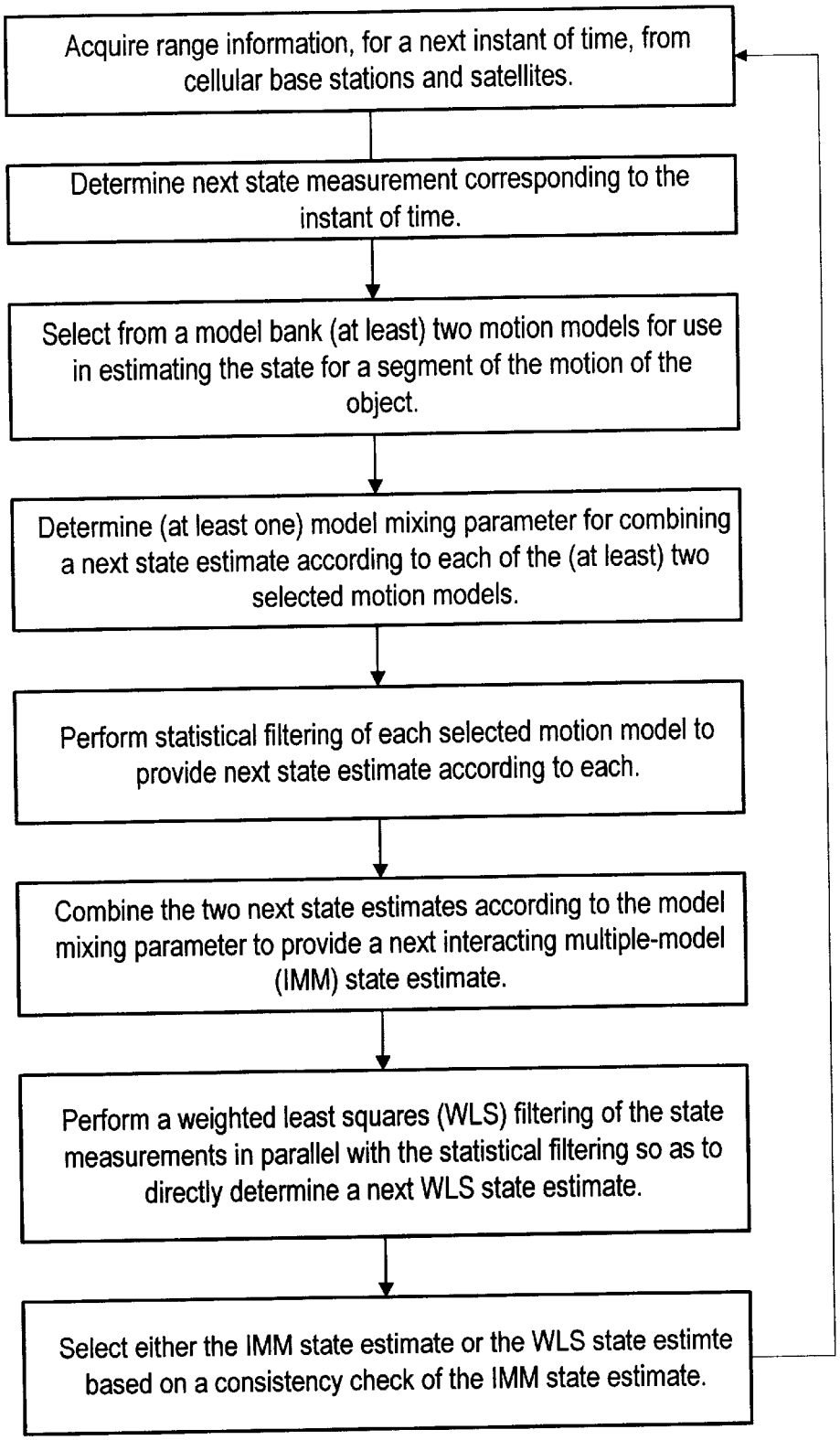
FIG. 3 is a flowchart of the method of the present invention in the preferred embodiment.

FIG. 3 is a flowchart of a method according to the present invention, in the preferred embodiment.

Applying the IMM algorithm solves the inconsistency problem of a Kalman-filter based method. The IMM algorithm is an efficient filter frame at which the user state estimate is obtained from the proper combination of a chosen number of tracks computed in accordance with a corresponding same number of pre-selected motion models (state sets). The simultaneous use of multiple models makes the IMM algorithm adaptable to a wide range of motion (including different maneuvers) and to a wide range of noise environments. The adaptability makes a navigation filter using IMM inconsistent less often, i.e. either the character of the motion or the noise environment must change more for the navigation filter with IMM to become inconsistent.

It should be understood, however, that the present invention comprehends using not only what is specifically referred to as the IMM algorithm, but using any algorithm that provides at least two motion models to a filter, i.e. any multiple-model algorithm. Moreover, it should be clear that there is no reason for restricting the filter used to filter each of the selected motion models to a statistical filter, such as Kalman filter. Any kind of filter could be used. In other words, either a statistical filter or a direct filter (i.e. a non-statistical filter) could be used in the present invention to filter a selected motion model, and it is even advantageous in some applications to use different kinds of filters, depending on the motion model. Thus, for example, any type of linear filter could be used.

By fusing an IMM-based navigation filter with a WLS filter, the filter is made robust, i.e. it is much less susceptible to inconsistency. Such a robust filter uses the IMM solution until there is an indication that the WLS solution should be used instead. If the IMM (filter) finds inconsistency, the current user PVT solution is eliminated and the IMM is restarted from the solution given by the WLS (and so based on only the most current set of measurements). The decision to change from using the IMM filter to using the WLS filter or to restart the IMM filter, is made by the IMM filter and is based on self-diagnostics performed by the IMM filter.

The robust filter of the present invention, a fused IMM and WLS filter, is significantly less sensitive to biased measurements, and much less often inconsistent. In such a filter, whenever the IMM filter cannot function satisfactorily, the WLS filter solutions are used to correct the IMM-based tracking.

It is to be understood that the above-described arrangements are only illustrative of the application of the principles of the present invention. Numerous modifications and alternative arrangements may be devised by those skilled in the art without departing from the spirit and scope of the present invention, and the appended claims are intended to cover such modifications and arrangements.

What is claimed is:

1. A generalized positioning system, for estimating the state of motion of an object, comprising:

a) a measurement engine, responsive to range information provided to the location of the object by a source of range information, the range information for use in determining a measurement of the state of motion of the object, the measurement engine for providing a succession of state measurements, each measurement corresponding to a different instant of time;

b) a model selector and a model bank, the model selector for selecting from the model bank at least one motion model for use in estimating the state for a segment of the motion of the object; and c) a filter, responsive to the succession of state measurements, and further responsive to a model mixing parameter and to the selected motion models, for determining a succession of multiple-model estimates of the state.

2. A generalized positioning system as in claim 1, further comprising:

a) a weighted least squares (WLS) filter, also responsive to the state measurements, for directly determining a succession of WLS state estimates; and b) a consistency checker, responsive to the WLS state estimates and to the multiple-model state estimates, for selecting either the WLS state estimate for an instant of time or the multiple-model state estimate for the instant of time, based on the multiple-model state estimate as well as on previous multiple-model state estimates.

3. A generalized positioning system as in claim 1, wherein the source of range information includes a cellular base station.

4. A generalized positioning system as in claim 3, wherein the source of range information includes a satellite.

5. A generalized positioning system as in claim 1, wherein the filter is a Kalman filter.

6. A generalized positioning system as in claim 1, wherein the filter is a non-linear filter.

7. A generalized positioning system as in claim 1, wherein the succession of multiple-model estimates of the state are as provided by an interacting multiple-model (IMM) algorithm.

8. A generalized positioning system as in claim 1, wherein the filter is a statistical filter.

9. A generalized positioning system as in claim 1, wherein the filter is a linear filter.

10. A generalized positioning system as in claim 1, wherein either at least the measurement engine or the filter is located in a network facility in radio communication with the object.

11. A generalized positioning system as in claim 1, wherein the measurement engine and the filter are both located with the object.

12. A generalized positioning system filter, for estimating the state of motion of an object, comprising:
   a) a model selector and a model bank, the model selector for selecting from the model bank at least one motion model for use in estimating the state for a segment of the motion of the object based on state measurements, each measurement corresponding to a different instant of time, the state measurement being at least in part based on range information provided to the location of the object; and
   b) a filter, responsive to a succession of state measurements provided to corresponding successive locations of the object, and further responsive to a model mixing parameter and to the selected motion models, for determining a succession of multiple-model state estimates.

13. A generalized positioning system filter as in claim 12, further comprising:
   a) a weighted least squares (WLS) filter, also responsive to the succession of state measurements, for directly determining a succession of WLS state estimates; and
   b) a consistency checker, responsive to the WLS state estimates and to the multiple-model state estimates, for selecting either the WLS state estimate for an instant of time or the multiple-model state estimate for the instant of time, based on the multiple-model state estimate as well as on previous multiple-model state estimates.

14. A generalized positioning system filter as in claim 13, wherein the succession of state measurements is provided by a measurement engine receiving range information provided by a source of range information.

15. A generalized positioning system filter as in claim 14, wherein the source of range information includes a cellular base station.

16. A generalized positioning system filter as in claim 15, wherein the source of range information includes a satellite.

17. A generalized positioning system filter as in claim 12, wherein the filter is a Kalman filter.

18. A generalized positioning system filter as in claim 5, wherein the filter is a non-linear filter.

19. A generalized positioning system filter as in claim 12, wherein the succession of multiple-model estimates of the state are as provided by an interacting multiple-model (IMM) algorithm.

20. A generalized positioning system filter as in claim 12, wherein the filter is a statistical filter.

21. A generalized positioning system filter as in claim 5, wherein the filter is a linear filter.

22. A generalized positioning system as in claim 14, wherein either at least the measurement engine or the filter is located in a network facility in radio communication with the object.

23. A generalized positioning system as in claim 14, wherein the measurement engine and the filter are both located with the object.

24. A generalized positioning system as in claim 14, wherein the steps are all performed at the location of the object.

25. A method for estimating the state of motion of an object, comprising the steps of:
   a) acquiring a next state measurement in a succession of state measurements, each state measurement being made based at least in part on range information provided to the location of the object;
   b) selecting from a model bank at least two motion models for use in estimating the state for a segment of the motion of the object based on the state measurements;
   c) determining a model mixing parameter for combining a next state estimate according to each of the at least two selected motion models;
   d) filtering each selected motion model to provide the next state estimate according to each of the at least two selected motion models based on the next state measurement; and
   e) combining the at least two next state estimates according to the model mixing parameter to provide a next multiple-model state estimate.

26. A method as in claim 25, further comprising the steps of:
   a) performing a weighted least squares (WLS) filtering of the state measurements in parallel with the filtering of each selected motion model so as to directly determine a next WLS state estimate from the next state measurement; and
   b) performing a consistency check, so as to be responsive to the next WLS state estimate and to the next multiple-model state estimate, for selecting either the next WLS state estimate or the next multiple-model state estimate, based on the multiple-model state estimate as well as on previous multiple-model state estimates.

27. A method as in claim 26, further comprising the step of acquiring range information provided by a source of range information from which a measurement of the state can be determined and providing the next state measurement.

28. A method as in claim 22, wherein the source of range information includes a cellular base station.

29. A method as in claim 28, wherein the source of range information includes a satellite.

30. A method as in claim 25, wherein the filtering is as performed by a Kalman filter.

31. A method as in claim 25, wherein the filtering is as performed by a non-linear filter.

32. A method as in claim 25, wherein the next multiple-model state estimate is as provided by an interacting multiple-model (IMM) algorithm.

33. A method as in claim 25, wherein the filtering is as performed by a statistical filter.

34. A method as in claim 25, wherein the filtering is as performed by a linear filter.

35. A method as in claim 25, wherein at least one of steps (b) through (e) is performed by a network facility in radio communication with the object.

* * * * *

UNITED STATES PATENT AND TRADEMARK OFFICE
CERTIFICATE OF CORRECTION

PATENT NO. : 6,609,080 B1
DATED : August 19, 2003
INVENTOR(S) : Jari Syrjärinne

It is certified that error appears in the above-identified patent and that said Letters Patent is hereby corrected as shown below:

Column 3,
Lines 29-30, "an extended too Kalman filter" should be -- an extended Kalman filter --.

Column 5,
Lines 50-60, array for $Q$ occurring in the last element, which occurs at line 60, "$\sigma_v^2$" should be -- $\sigma_\omega^2$ --.

Column 6,
Line 8, "$x = [x \; \dot{x} \; \ddot{x} \; y \; \dot{y} \quad\quad z \; \dot{z} \; \ddot{z} \; t \; \dot{t}]^T$" should be -- $x = [x \; \dot{x} \; \ddot{x} \; y \; \dot{y} \; \ddot{y} \; z \; \dot{z} \; \ddot{z} \; t \; \dot{t}]^T$ --.

Column 7,
Line 4, "$\Delta x \; [H^T(W^{-1})H]^{-1} H^t(W^{-1})\Delta\rho$" should be -- $\Delta x = [H^T(W^{-1})H]^{-1} H^T(W^{-1})\Delta\rho$ --.

Column 9,
Line 60, "as in claim 5" should be -- as in claim 12 --.

Column 10,
Line 1, "as in claim 5" should be -- as in claim 12 --.
Lines 3, 7 and 10, "positioning system as in" should be -- positioning system filter as in --.

Signed and Sealed this

First Day of June, 2004

JON W. DUDAS
*Acting Director of the United States Patent and Trademark Office*